(12) United States Patent
Tanaka et al.

(10) Patent No.: US 6,202,738 B1
(45) Date of Patent: *Mar. 20, 2001

(54) ASSEMBLED STRUCTURE HAVING AN ENLARGED HEAT TRANSFER AREA FOR HEAT RADIATION THEREFROM

(75) Inventors: Naoto Tanaka; Katsuyuki Moritsugi, both of Miyota (JP)

(73) Assignee: Minebea Company, Ltd., Nagano-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/977,722

(22) Filed: Nov. 25, 1997

(30) Foreign Application Priority Data

Dec. 3, 1996 (JP) .................................... 8-322992

(51) Int. Cl.[7] ...................................... H05K 7/20
(52) U.S. Cl. .................. 165/80.3; 165/185; 361/690; 361/704; 257/722
(58) Field of Search ................... 165/80.3, 155, 165/121; 174/16.3; 361/690, 704, 697; 257/722

(56) References Cited

U.S. PATENT DOCUMENTS

| 1,728,537 | * | 9/1929 | Geiger | 165/80.3 X |
| 2,289,984 | * | 7/1942 | Mouromtseff et al. | 165/80.3 X |
| 2,947,957 | * | 8/1960 | Spindler | 165/80.3 X |
| 3,388,739 | * | 6/1968 | Olson et al. | 165/80.3 |
| 4,777,560 | * | 10/1988 | Herrell et al. | 165/80.3 X |
| 5,502,619 | * | 3/1996 | Wang | 361/697 |
| 5,583,746 | * | 12/1996 | Wang | 361/697 |

FOREIGN PATENT DOCUMENTS

| 54921 | * | 4/1951 | (FR) | 16/185 |
| 1247069 | | 1/1960 | (FR) . | |
| 573773 | | 12/1945 | (GB) . | |
| 591996 | * | 9/1947 | (GB) | 165/80.3 |
| 59-28847 | | 2/1984 | (JP) . | |
| 80953 | * | 5/1984 | (JP) | 165/185 |
| 62-18056 | | 1/1987 | (JP) . | |

* cited by examiner

*Primary Examiner*—Leonard Leo
(74) *Attorney, Agent, or Firm*—Staas & Halsey LLP

(57) ABSTRACT

An assembled structure of laminate plates, wherein a plurality of spaces exists between peripheries of the laminated plates. Thus, the outer surface of the structure is enlarged for improved radiation efficiency.

7 Claims, 6 Drawing Sheets

ASSEMBLED STRUCTURE HAVING AN ENLARGED HEAT TRANSFER AREA FOR HEAT RADIATION THEREFROM

BACKGROUND OF THE INVENTION

1. Field of the Invention

The invention is related to an assembled structure of a plurality of laminated plates, in particular, a structure wherein the outer surface is enlarged for promotion of heat radiation therefrom.

2. Description of the Prior Art

In electronic parts having any current circuits other than superconducting circuits, an electric current flowing therein inevitably generates heat.

The heat is radiated into an atmosphere surrounding the electronic parts.

If the quantity of heat generated in the electric circuits exceeds what is removed therefrom, the electric parts accumulate heat therein and naturally increase their own temperature.

An excessive temperature increase of the electronic parts finally brings the device to thermal destruction.

As a measure of avoiding such a problem, it is conventional to enlarge dimensions of the electric parts to thereby sufficiently increase the outer surface and its heat capacity. This realizes an appropriate heat balance between generation and radiation of heat to restrain its temperature increase.

If it is impossible to employ such a technique as to increase sufficiently the outer surface and heat capacity of the parts, the following conventional methods are used. For instance, there is formed a heat sink to be connected to such an electric device as a power transistor and to radiate heat of the transistor. Another method is to blow air by using a fan onto a targeted device surface to remove forcibly heat therefrom.

An electric rotary machine, like a stepping motor and so on, has cores of soft magnetic material around which coils are wound, and is rotated by magnetic flux passing through the cores which is caused by an electric current flowing in the windings of the coils.

An electric current flowing in a wound coil causes some quantity of heat therein. At the same time it generates magnetic flux to go through the core and also causes some heat therein because of magnetic resistance of the core.

The heat brought by the magnetic flux is radiated from a surface of the core into an atmosphere. This core is conventionally made of a plurality of laminate sheets each of which results resulted from punching an original magnetic sheet.

It is further explained below about parts of a magnetic rotary machine obtained by laminating a plurality of punched magnetic sheets.

The punched magnetic sheets, each of which is shown in FIG. 10, are laminated in congruency with each other to form a laminated body 51 for the parts as illustrated in FIG. 11 (it illustrates an example of a stator core of a stepping motor.). Thus, a stepping motor is obtained as shown in FIG. 12.

In FIG. 12, the numerals of 52, 53 and 54 represent a rotary shaft, a magnet secured to the rotary shaft 52 and a coil wound around the laminated body 51 (a stator core). Heat generated inside the stepping motor 55 is radiated from the surface thereof toward the surrounding atmosphere. However, in case that such radiation is insufficient for cooling, it is necessary to adopt any of the following measures of enlarging dimensions of a stepping motor, connecting a heat source to a heat sink outside, and blowing air onto an outer surface of a stepping motor to forcibly radiate heat toward the surrounding air.

In design of a transformer having a core of magnetic laminate sheets, the core needs to be provided with a minimum essential cross-sectional area through which the necessary magnetic flux must pass depending upon the design requirement. However, as a result of designing a small size transformer according to such a manner, it reaches such a problem that a temperature of the magnetic core is gradually increased because of insufficient heat radiation therefrom.

To avoid the problem, a conventional method is to make a size of a magnetic core larger than that to be required in view of the design method mentioned above.

On the other hand, there is a demand for reducing an outer size of a magnetic core to be as small as possible because recently it is valued to make an electric apparatus small and compact.

In the electric assemblies like electronic parts, electric rotary machines and transformers mentioned above, there appear the following problems. That is, if heat generated in the assembly is handled to be removed by natural radiation, the assembly naturally becomes large in size. Using a heat sink for radiation, requires a lot of metalworking steps including molding a metal body with fins for a heat sink and subjecting the heat sink to a cutting process to form a plain surface thereon for connection with the assembly. Moreover, such a heat sink is expensive because of increases of the number of manufacturing steps and also makes the resultant assembly large in size. If a heat sink is provided with an air blowing means like a cooling fan, the resultant product becomes large and expensive after all.

SUMMARY OF THE INVENTION

This invention is directed toward solving the above problems in the prior arts. The object of the invention is to provide a laminated assembly having a simple structure for heat radiation. In detail, this invention is to provide a laminated assembly having an enlarged outer surface so that heat radiation therefrom is promoted when it is either integrally fixed or attached to electric parts generating heat.

For the purposes of the invention, this invention provides a laminated assembly comprising a plurality of laminated plates having high thermal conductivity wherein a plurality of pairs of adjacent ones of the laminated plates is positioned in no congruity with each other and thereby a plurality of slits is formed between the periphery portions of the laminated plates, whereby the outer surface of the assembly is enlarged for promoting heat radiation therefrom.

In respect of shape of the plates, it is possible to use rectangular plates of the same shape and plates different shapes.

The laminated assembly can be applied to a magnetic core which is used as a stator core of a rotary electric machine or is used in a transformer. One layer of the magnetic core of the transformer includes both an E-shaped magnetic sheet and an I-shaped magnetic sheet. A width of one leg of the E-shaped magnetic sheet and a width of the I-shaped magnetic sheet are larger than the other one of the E-shaped magnetic sheet.

The laminated assembly can also be applied to a radiator suitable for electric parts.

DESCRIPTION OF THE PREFERRED EMBODIMENTS

Figure 1:
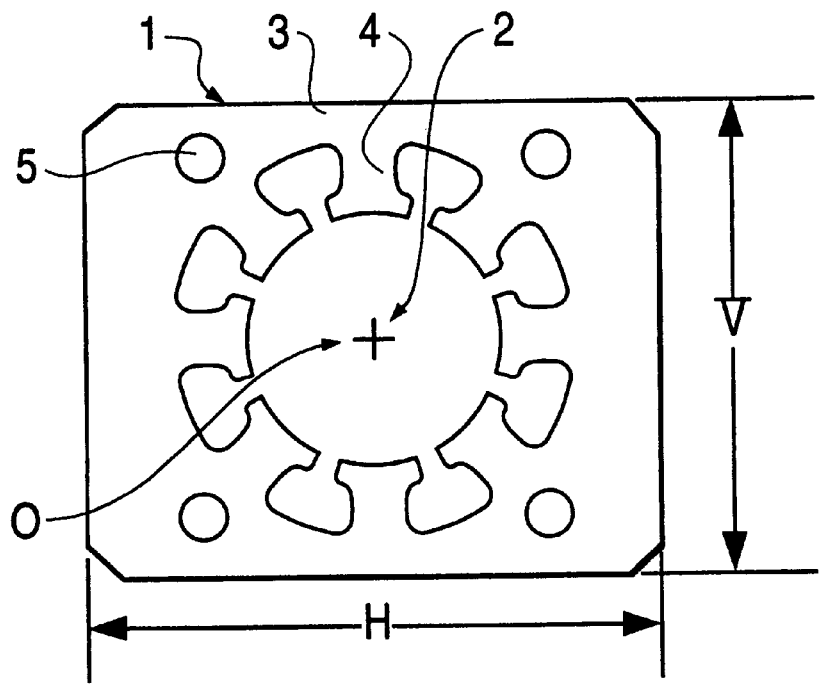
FIG. 1 is a plan view of a magnetic sheet used in an embodiment of the invention.
Figure 2:
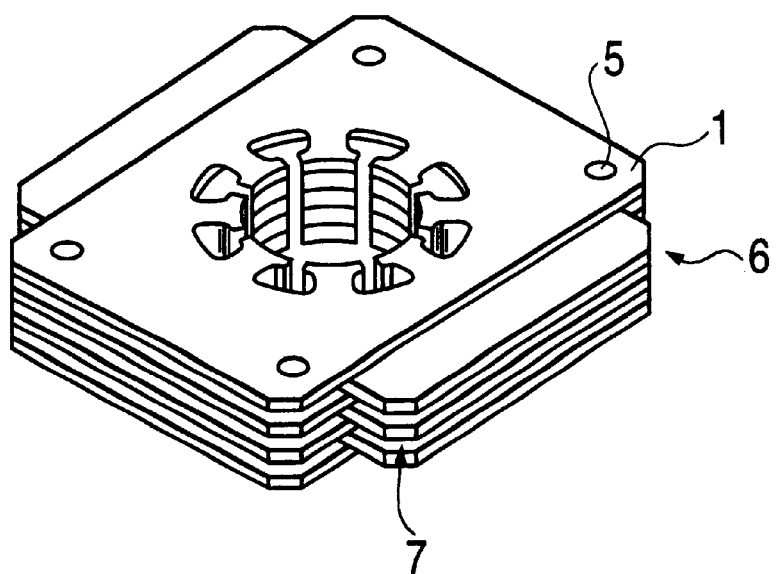
FIG. 2 is a perspective view showing a laminated assembly of magnetic sheets in an embodiment of the invention.

Exemplary embodiments of the invention will be now described in conjunction with the accompanying drawings. First, an embodiment is shown in which this invention is applied to an assembly of a stator core in a stepping motor. FIG. 1 is a plan view of a magnetic sheet for a stator core. There is provided a circular opening 2 at the center of the sheet 1 for accommodating a rotator magnet. A plurality of projection parts extend from an outer periphery 3 of the sheet 1 toward the circular opening 2 for forming stator magnetic poles 4. These projection parts are positioned at even central angle 90°/N (N is an integer) viewed from the center O of the opening 2. In this embodiment, the number N is two (2) and so the central angle is forty-five (45) degree.

The numeral 5 is a hole for firmly fixing the plural sheets to form the stator. These four fixing holes 5 are placed on the same circle at even intervals of central angles of 90 degrees. This make it possible that one sheet is put on another sheet in such a manner as to turn the alternate sheets round in a 90-degree arc because each position of the holes 5 of the turned sheets remain in alignment with those of the other sheets.

The horizontal length H is larger than the vertical length V in the sheet (H>V).

The sheets 1 configured as above are put on each other and the alternate ones are turned 90-degrees. Four rods are inserted into the fixing holes 5 of the sheets 1 and the holes 5 are caulked. Thus, it leads to the laminated assembly 6 for the stator core.

Coils are directly wound around each stator pole 4 of the laminated assembly 6, which constitutes an element of a stepping motor (not shown in the drawings). In the stepping motor, the first pulse current flows in one pair of the coils and the second current flows in another pair of them. Similarly, by applying subsequent pulse currents to the coils, a rotor of the stepping motor is rotated.

A pulse electric current is supplied to each coil through electric circuits outside the motor and the current strength varies in accordance with the load. The temperature increase of the motor is mainly caused by both copper loss in coils and core loss in the laminated assembly. Heat generated in the stator core is transferred to the whole of the motor.

On the other hand, as mentioned above, the vertical length V and horizontal length H of the magnetic sheet 1 are different from each other, and each of the magnetic sheets 1 is put on its adjacent sheet in such a manner that the alternative sheets are turned 90-degrees.

Accordingly, there are formed a lot of slits 7 along the peripheries of the sheets on the outer surface of the assembly. The depth of the slits 7 is shown as L=(H−V)/2.

Figure 3:
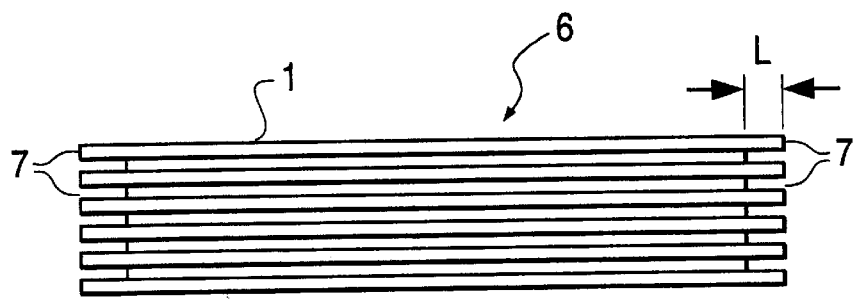
FIG. 3 is a side view of the laminated assembly in FIG. 2.

Since there are thus formed slits on the side surface of the laminated assembly of the stator core as shown in FIG. 3, the surface exposed to the surrounding air is enlarged greatly. As a result, it radiates greater amount of heat to the air than any stator core in the prior art.

Figure 4:
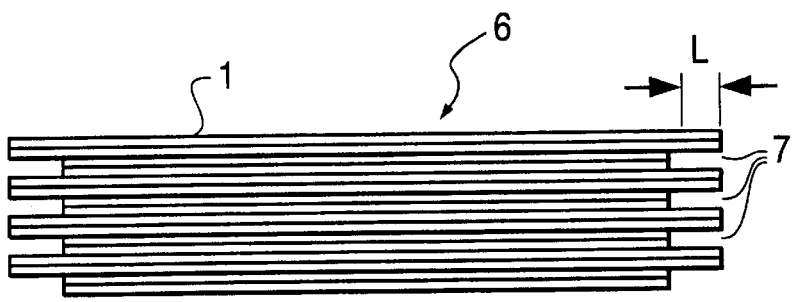
FIG. 4 is a side view of a laminated assembly of an embodiment of the invention.

FIG. 4 is a cross section showing the second exemplary embodiment. It uses sheet units each including two adjacent magnetic sheets 1,1 put together congruently. In this case, the alternate sheet units are turned 90-degrees around the center thereof. Though the whole outer surface becomes smaller than that of the first embodiment, the increased width of each slit 7 improves ventilation therethrough. In the end, the radiation efficiency almost remains unchanged.

Figure 5:
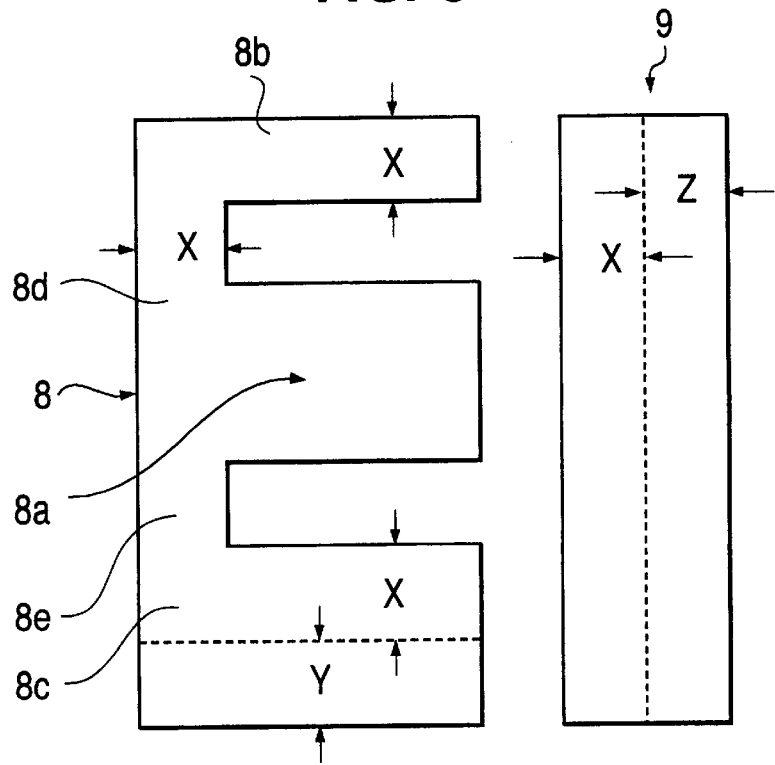
FIG. 5 is a plan view of a magnetic sheet used in a magnetic core of a transformer to which the invention is applied.

Next, there is shown an embodiment in which this invention is applied to a magnetic core of a transformer. In almost all transformers having a magnetic core of laminated magnetic sheets, the magnetic sheet is prepared in such a manner that an E-shaped magnetic sheet 8 having the shape of the English alphabetic E is combined with an I-shaped magnetic sheet 9 having the shape of the English alphabetic I on the same plane, as shown in FIG. 5.

In the E-shaped magnetic sheet 8, a center portion 8a and two legs 8b and 8c are connected to yoke portions 8d and 8e. In general, each width of legs 8b and 8c is half that of the center portion 8a. However, in this embodiment the width of the leg 8c is larger than the width X of the leg 8b by a width Y. As known from FIG. 5, the length of the I-shaped magnetic sheet 9 is equal to that of the E-shaped magnetic sheet 8, however, the width of the I-shaped magnetic sheet 9 is larger than that of the leg 8b by a width Z.

Figure 6:
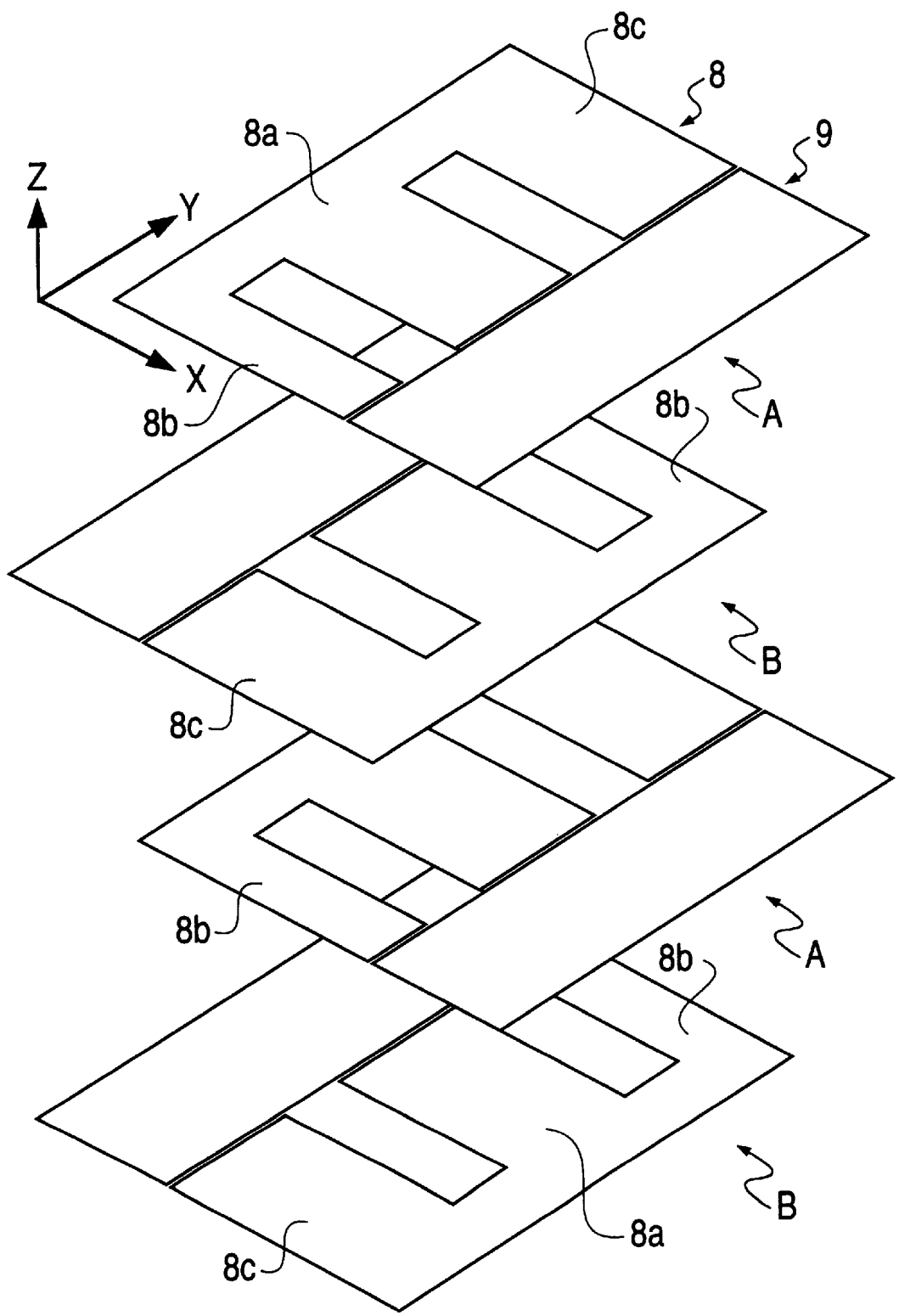
FIG. 6 is a perspective view showing how two kinds of magnetic sheets are alternately put on another.

The E-shaped magnetic sheet 8 and the I-shaped magnetic sheet 9, as shaped above, are combined together as shown in FIG. 6 to shape a pattern "A" sheet. Further, a pattern "B" sheet is formed in such a manner that the pattern "A" sheet is turned 180-degrees in the X direction axis and subsequently is turned 180-degree in the Y direction axis.

The pattern "A" sheet and the pattern "B" sheet are alternately laminated to form a magnetic sheet assembly (magnetic core) of a transformer whose side walls are provided with a plurality of slits having the same thickness as that of the sheet. As a result, the radiation efficiency of the magnetic core is improved because the surface area is enlarged greatly. In this embodiment, each single sheet of the patterns "A" and "B" is alternately laminated. However, with reference to each pattern sheet of "A" and "B", it is possible to use pattern sheet units "A" and "B" each of which includes a plurality of pattern "A" and "B" sheets respectively so that a pattern "A" sheet unit and pattern "B" sheet unit are alternately laminated. Such constitution increases the width of the slits between the units and improves ventilation through the slits for heat radiation.

Figure 7:
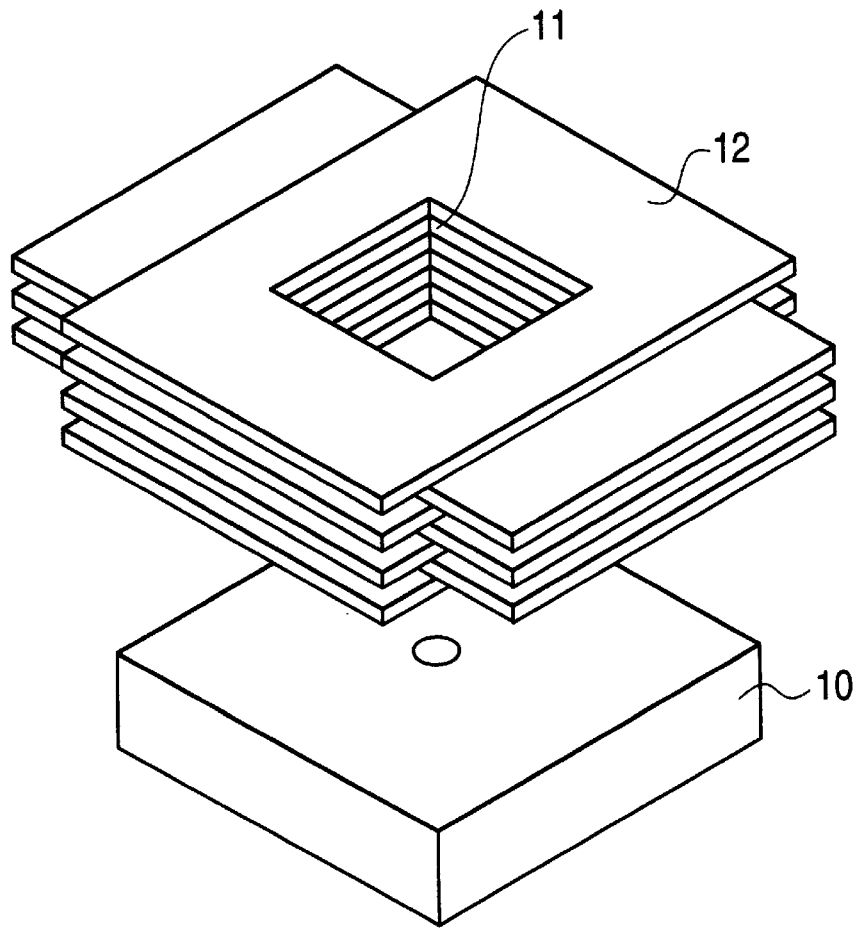
FIG. 7 is a perspective view showing an embodiment where the invention is applied to a radiator of electronic parts.

Further, referring to FIG. 7, there is described an embodiment in which the invention is applied to a radiator of electronic parts. The numeral 12 is a rectangular shaped radiation plate with high thermal conductivity such as metal plate where a hole 11 is punched at the center portion thereof for allowing electronic parts to enter therein. A plurality of radiation plates 12 is put together in such a manner that two adjacent plates form a cross shape and are formed into a lamination on a metal substrate 10 which bears electronic parts thereon.

Figure 8:
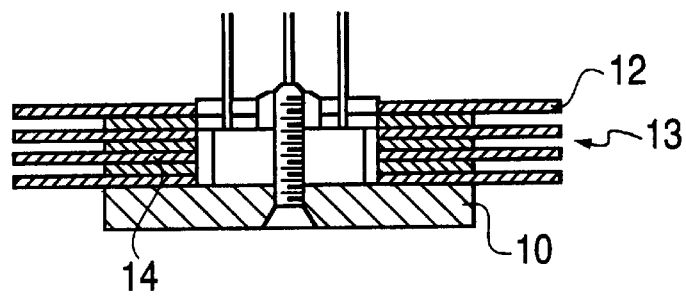
FIG. 8 is a cross sectional view showing an embodiment where electronic parts are connected to a radiator to which the invention is applied.
Figure 9:
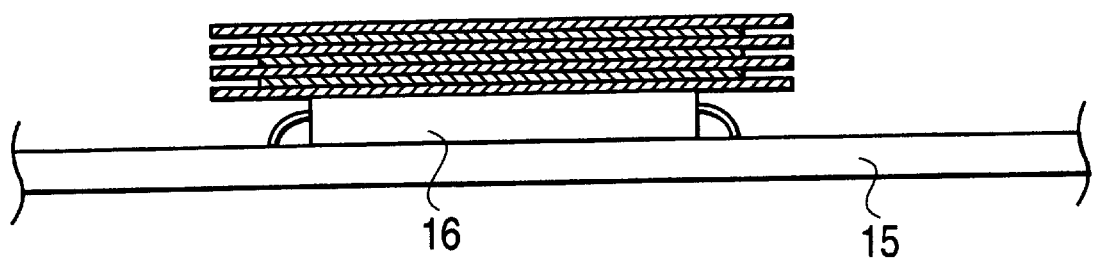
FIG. 9 is a cross sectional view showing another embodiment where electronic parts are connected to a radiator to which the invention is applied.
Figure 10:
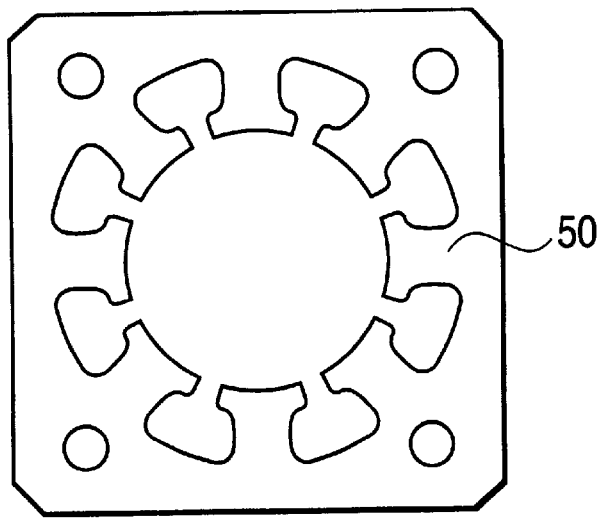
FIG. 10 is a plan view of a magnetic sheet for a magnetic core of a stepping motor in the prior art.
Figure 11:
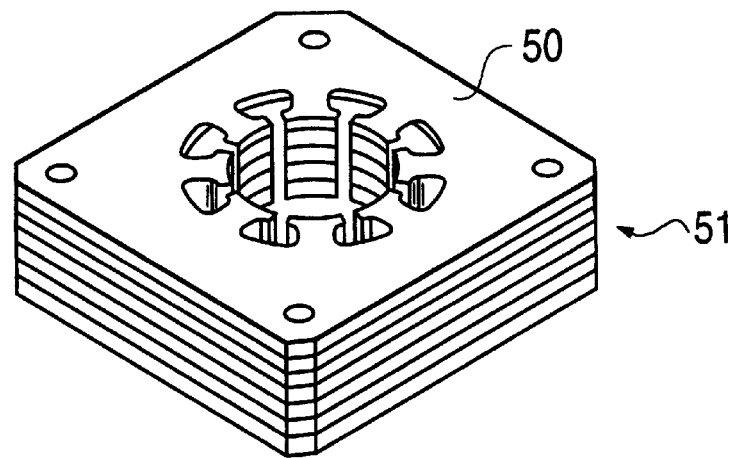
FIG. 11 is a perspective view of a laminated assembly used as a magnetic core of a stepping motor in the prior art.
Figure 12:
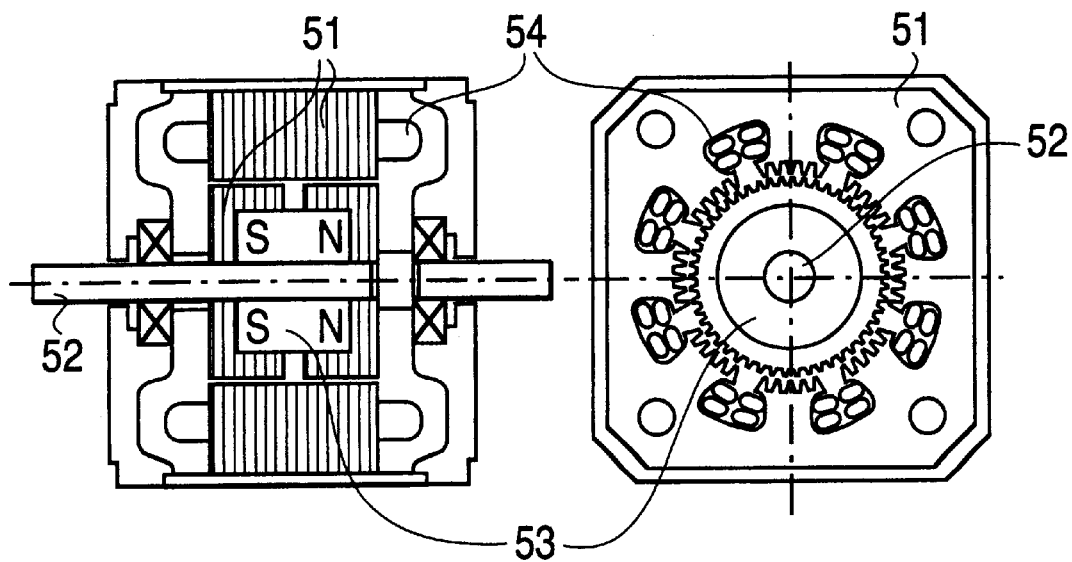
FIG. 12 is a cross sectional view of a stepping motor in the prior art.

At that time, the insertion holes 11 of all plates are congruent with one another from the upper plate to the bottom. The radiation plates 12 thus laminated are fixed onto the substrate by spot-welding, screw fastening, and so on. Then, the electronic parts 14 such as a bridge rectifier is secured within the insertion hole 11 of the assembly 13 thus constructed as shown in FIG. 8.

Most of the heat generated in the electronic parts travels along the substrate 10 and subsequently from the bottom to the top of the radiation plates 12, and finally is emitted from the whole surface of the radiation plates 12 toward an atmosphere.

If the laminated assembly of the invention is applied to a radiator for an electronic device 16 with a flat upper surface such as a central processing unit, such an insertion holes 11 is not necessarily required. The above embodiment employs the rectangular sheets of the same shape only wherein two adjacent sheets cross at a right angle. However, it is also preferable that two differently shaped sheets such as rectangular and square ones are alternately put on one another and made into a laminated assembly having the slits therearound.

Although the present invention has been described by way of the above embodiments, it is to be appreciated that a variety of modifications and applications are possible within the scope and spirit of the present invention and are not intended to be excluded from the scope of the present invention.

Thus, according to the present invention there can be provided a laminated assembly of a plurality of plates having high thermal conductivity wherein there is formed a non-contact portion between the peripheries of the adjacent plates not positioned in congruity with each other, and the side surface of the assembly is provided with slits between the peripheries of the non-adjacent plates. Therefore, the radiating outer surface can be enlarged to enhance the cooling efficiency.

Since the laminated assembly can be manufactured only by laminating the plates with high thermal conductivity, it is advantageous in that the structure is very simple and the manufacturing cost is reduced. Accordingly, if the invention is applied to the electronic device whose rating remains unchanged, it is possible to reduce the dimensions of the device and fix it in smaller space. Further, if both the rating and the dimensions remains unchanged, it can prevent the device from inceasing its own temperature and raise the reliability.

What is claimed is:

1. An assembled structure of a plurality of laminated plates having high thermal conductivity, the assembled structure comprising:

a plurality of laminated plates, each having a length and a width, and each being laminated alternatively with an adjacent abutting plate such that a length of one plate is perpendicular to the width of the adjacent plate, with the length of one plate overhanging beyond the width of an adjacent plate, the overhanging portions serving to dissipate heat from the plates, wherein the laminated plates include two differently shaped plates selected from rectangular and square.

2. The assembled structure according to claim 1, wherein each plate is a magnetic sheet and the assembled structure forms a magnetic core.

3. The assembled structure according to claim 2, wherein the magnetic core is applied to a stator core of a rotary electric machine.

4. The assembled structure according to claim 1, wherein the structure is applied to a radiator for electronic parts.

5. The assembled structure according to claim 1, wherein the laminated plates are mounted on a metal substrate by means for fixing the laminated plates.

6. The assembled structure according to claim 5, wherein the means for fixing is spot welding.

7. The assembled structure according to claim 5, wherein the means for fixing is screw fastening.

* * * * *